United States Patent
Sporer

(10) Patent No.: US 9,801,303 B2
(45) Date of Patent: Oct. 24, 2017

(54) ENCLOSURE FOR HERMETICAL ENCAPSULATED ELECTRONICS

(71) Applicant: Abaco Systems, Inc., Huntsville, AL (US)

(72) Inventor: Bernd Sporer, Bobingen (DE)

(73) Assignee: Abaco Systems, Inc., Huntsville, AL (US)

( * ) Notice: Subject to any disclaimer, the term of this patent is extended or adjusted under 35 U.S.C. 154(b) by 0 days.

(21) Appl. No.: 15/024,715

(22) PCT Filed: Sep. 24, 2013

(86) PCT No.: PCT/US2013/061329
§ 371 (c)(1),
(2) Date: Mar. 24, 2016

(87) PCT Pub. No.: WO2015/047217
PCT Pub. Date: Apr. 2, 2015

(65) Prior Publication Data
US 2016/0234964 A1    Aug. 11, 2016

(51) Int. Cl.
*H05K 7/20* (2006.01)
*H05K 1/18* (2006.01)
(Continued)

(52) U.S. Cl.
CPC ......... *H05K 7/20127* (2013.01); *H05K 1/181* (2013.01); *H05K 5/06* (2013.01);
(Continued)

(58) Field of Classification Search
CPC ........... H05K 7/20127; H05K 7/20509; H05K 7/1421; H05K 1/181; H05K 5/06; H05K 7/20563
(Continued)

(56) References Cited

U.S. PATENT DOCUMENTS 4,458,296 A    7/1984  Bryant et al.
5,170,320 A    12/1992 Pease
(Continued)

FOREIGN PATENT DOCUMENTS

EP    0824302 A1    2/1998
EP    824302 B1 *  5/2001    ............... H05K 7/20
(Continued)

OTHER PUBLICATIONS

PCT Search Report and Written Opinion issued in connection with corresponding PCT Application No. PCT/US2013/061329 dated May 28, 2014.

*Primary Examiner* — Timothy Thompson
*Assistant Examiner* — Charles Pizzuto
(74) *Attorney, Agent, or Firm* — Meunier Carlin & Curfman LLC

(57) ABSTRACT

Provided is an enclosure for encapsulating one or more printed circuit boards (PCBs) configured for having electronic devices mounted thereon. The enclosure includes a main chassis body including a bottom portion and an outer wall including connectable panels for encasing the main chassis body. The enclosure also includes a top portion configured for completing a seal between the main chassis body and the outer wall, wherein one of the PCBs forms one of the connectable panels.

20 Claims, 4 Drawing Sheets

(51) Int. Cl.
    *H05K 5/06*     (2006.01)
    *H05K 7/14*     (2006.01)
(52) U.S. Cl.
    CPC ....... *H05K 7/1421* (2013.01); *H05K 7/20509* (2013.01); *H05K 7/20563* (2013.01)
(58) Field of Classification Search
    USPC ........................................................ 174/526
    See application file for complete search history.

(56) References Cited

U.S. PATENT DOCUMENTS

| | | | |
|---|---|---|---|
| 5,190,241 | A | 3/1993 | Pease |
| 5,570,270 | A | 10/1996 | Naedel et al. |
| 5,737,194 | A | 4/1998 | Hopkins et al. |
| 5,940,266 | A | 8/1999 | Hamilton et al. |
| 5,995,368 | A | 11/1999 | Lee et al. |
| 6,797,879 | B2 | 9/2004 | Leyda et al. |
| 7,869,209 | B2 | 1/2011 | Nemoz et al. |
| 2002/0012236 | A1 | 1/2002 | Dimarco |
| 2007/0211711 | A1* | 9/2007 | Clayton ............ G11C 5/04 370/360 |
| 2008/0273316 | A1 | 11/2008 | Sarno et al. |
| 2009/0213543 | A1 | 8/2009 | Nemoz et al. |
| 2009/0244831 | A1 | 10/2009 | Nemoz et al. |
| 2010/0008053 | A1 | 1/2010 | Osternack et al. |
| 2010/0033920 | A1 | 2/2010 | Bellin et al. |
| 2012/0069519 | A1* | 3/2012 | Caron ............ H05K 7/20636 361/691 |
| 2012/0285665 | A1 | 11/2012 | Rebeyrotte et al. |
| 2013/0170132 | A1 | 7/2013 | Bellin et al. |

FOREIGN PATENT DOCUMENTS

| | | |
|---|---|---|
| FR | 2933267 A1 | 1/2010 |
| GB | 1326972 A | 8/1973 |
| GB | 2230147 A | 10/1990 |

\* cited by examiner

ENCLOSURE FOR HERMETICAL ENCAPSULATED ELECTRONICS

I. FIELD OF INVENTION

The present invention is related to cooling hermetical encapsulated electronics. More specifically, the present invention is related to efficiently cooling electronic devices hermetically encapsulated within a sealed enclosure.

II. BACKGROUND OF THE INVENTION

As the footprint of electronic components continues to decrease, enabling greater numbers of components to be placed on a printed circuit board (PCB), efficiently dissipating heat produced by the components becomes more challenging. This problem is amplified as even more of these PCBs are housed within a single enclosure, or chassis.

Traditionally, air is used as the catalyst for dissipating heat and cooling the electronic components electronics within the enclosure. But as the performance demands of these electronic components continues to increase, the traditional heat dissipating approaches become more inefficient and less effective. This ineffectiveness is particularly true in instances where the chassis is sealed, which is most often the case where the chassis is used as a line replaceable units (LRU).

LRUs are used primarily as modular components on aircraft and typically contain aircraft electronics. Usually, these enclosures are not sealed. Cooling air streams through the enclosure in order to remove heat generated by the electronics inside the enclosure. These LRU's are widely used, for example, in military aircraft applications. The Aeronautical Radio, Incorporated (ARINC) 600 standards specification defines rack and panel sizes, weights, connectors, mounting positions, cooling features, and other characteristics associated with aircraft LRU's. Also, available air mass, according to the size of the LRU, is specified. The air mass is used to cool the electronic devices inside the LRU. FIG. 1, for example, is an illustration of an ARINC 600 LRU enclosure 100, in which embodiments of the present invention may be practiced.

In FIG. 1, the ARINC 600 enclosure includes a front panel 102 and a rear panel 104. As noted above, air masses can be used to cool electronic devices mounted on a printed circuit board (PCB) inside the enclosure 100. The ARINC 600 standards specification also governs drilled holes in a defined area at the bottom of the enclosure 100 (not shown) and drilled holes 106 at a top of the enclosure 100.

During operation, for example, cooling air can be injected into a bottom air inlet area and will stream through the enclosure 100, through the drilled holes 106, and out of the enclosure 100. This process of streaming air through the enclosure 100 removes heat from the electronic devices. This streaming air, however, exposes the electronic devices to an outer, potentially harmful, external environment. This external environment can be detrimental to the operation and reliability of the electronic devices.

For example, filtering of the external air could be deficient such that as the streaming air comes into contact with the electronic devices, the devices can be damaged. Salt filled air, for example, can have a corrosive effect on the electronics. There are many other disadvantages to the cooling mechanics of the conventional ARINC 600 LRU enclosure 100.

An additional disadvantage is that the streaming air must be filtered to a certain level in order to prevent a sandblasting effect on the electronic devices. Also, in the case of eruption of fire inside the LRU enclosure 100, smoke will be distributed along the cooling paths, permitting the fire to expand to other areas within the enclosure 100. These disadvantages can significantly impact performance, reduce the mean time between failure (MTBF) of the electronic devices, and decrease their reliability.

III. SUMMARY OF EMBODIMENTS OF THE INVENTION

Given the aforementioned deficiencies, a need exists for improved techniques for cooling electronic devices mounted on PCBs within sealed LRU enclosure. More specifically, a need exists for improved cooling techniques for an ARINC 600 enclosure having encapsulated electronic devices.

An embodiment of the present invention includes an enclosure for encapsulating one or more PCBs configured for having electronic devices mounted thereon. The enclosure includes a main chassis body including a bottom portion and an outer wall including connectable panels for encasing the main chassis body. The enclosure also includes a top portion configured for completing a seal between the main chassis body and the outer wall, wherein one of the PCBs forms one of the connectable panels.

Embodiments of the present invention provide an LRU enclosure constructed in accordance with ARINC 600 specification standards. The enclosure includes inlet air streams throughout the enclosure to a top portion, and out of the enclosure. Heat dissipated from the electronic devices mounted on PCBs within the LRU will be removed via the inlet air streams. At least one of the panels of the enclosure is formed from one of the PCBs. Electronic devices mounted on this one PCB are encapsulated within the LRU enclosure.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

IV. BRIEF DESCRIPTION OF THE DRAWINGS

The accompanying drawings, which are incorporated herein and form part of the specification, illustrate the present invention and, together with the description, further serve to explain the principles of the invention and to enable a person skilled in the relevant art(s) to make and use the invention.

DETAILED DESCRIPTION OF THE PREFERRED EMBODIMENTS

While the present invention is described herein with illustrative embodiments for particular applications, it should be understood that the invention is not limited thereto. Those skilled in the art with access to the teachings provided herein will recognize additional modifications, applications, and embodiments within the scope thereof and additional fields in which the invention would be of significant utility.

As used in this application, the terms "component", "module", "system", "interface", or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer.

Figure 1:
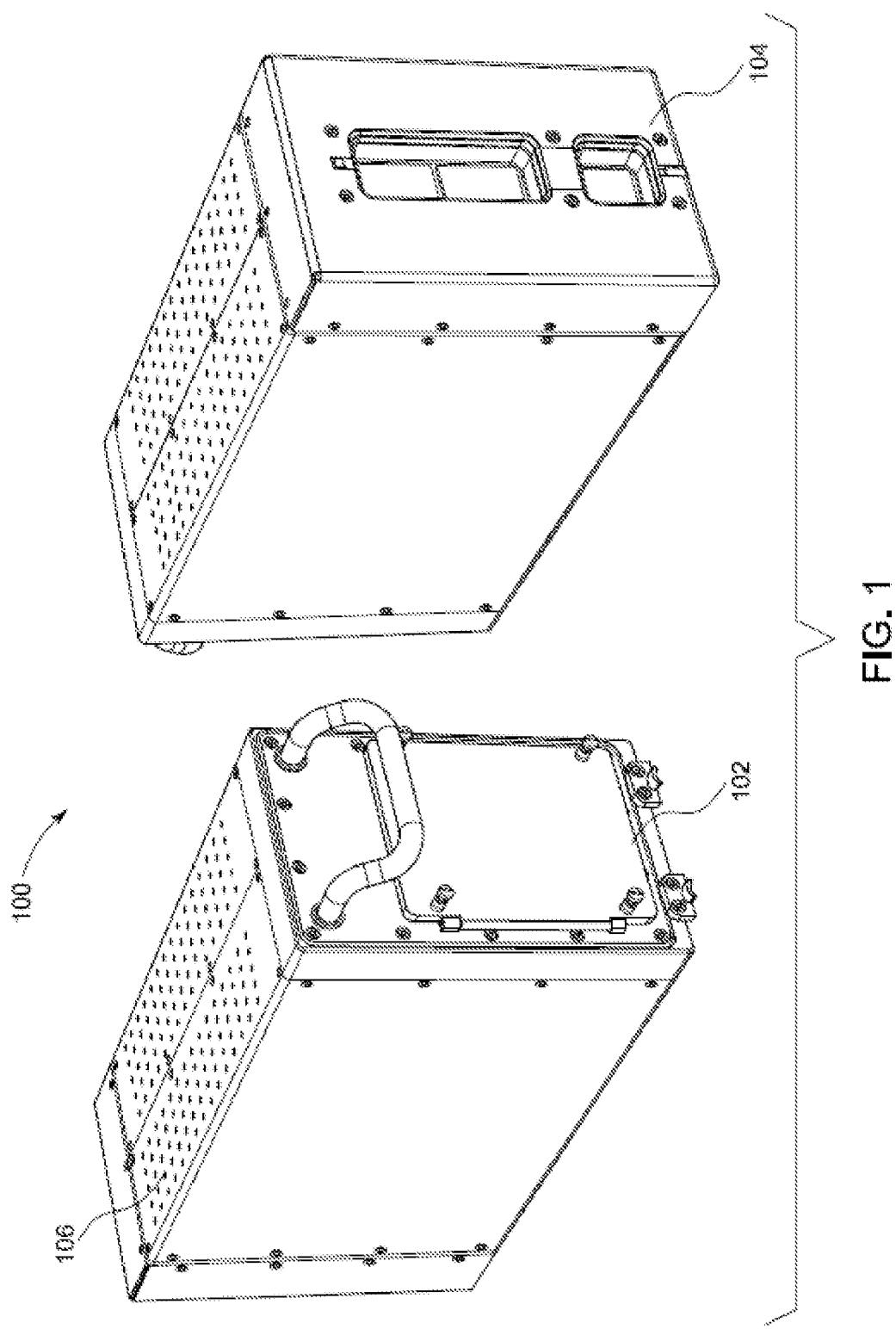
FIG. 1 is an illustration of an ARINC 600 enclosure in which embodiments of the present invention may be practiced.
Figure 2:
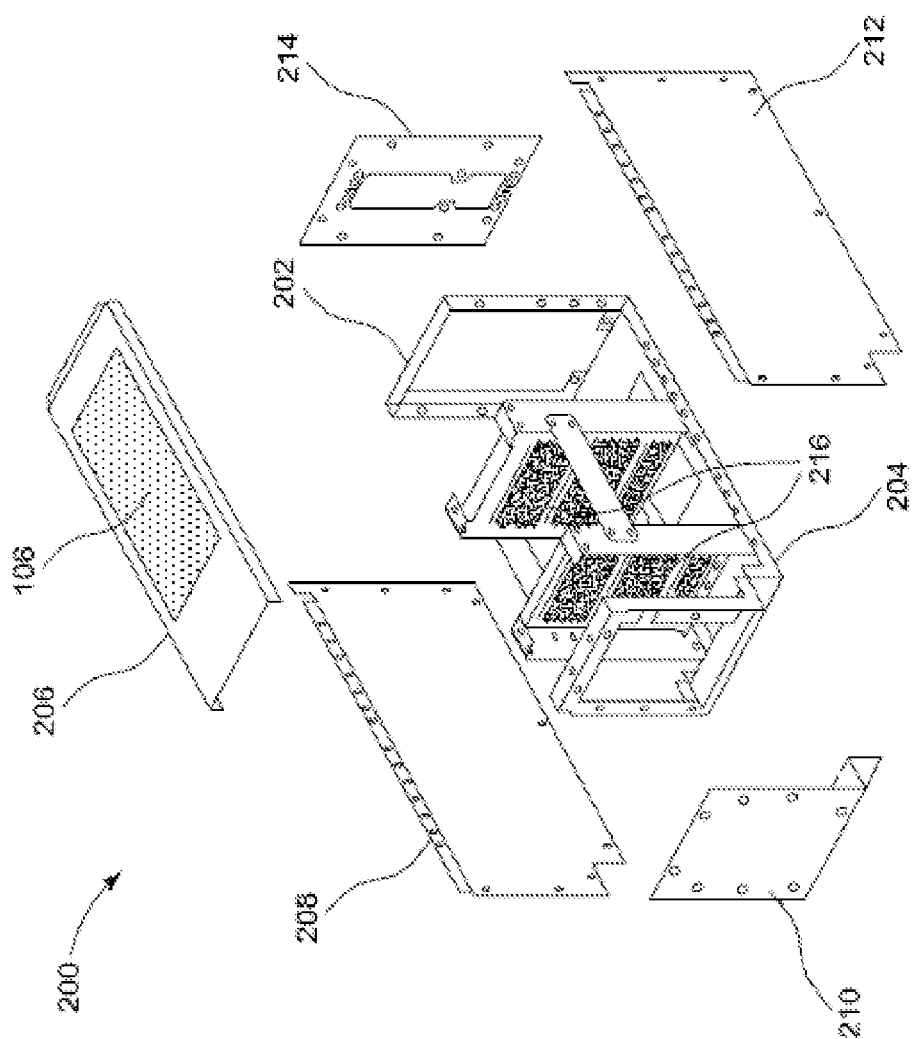
FIG. 2 is an expanded view of the conventional ARINC 600 enclosure illustrated in FIG. 1.

FIG. 2 is an expanded view 200 of the conventional ARINC 600 enclosure 100 illustrated in FIG. 1. In FIG. 2, the LRU enclosure 100 includes a main chassis body 202 having a bottom panel portion 204 and a top panel portion 206. The enclosure 100 also includes a wall portion including side panels 208, 210, 212, and 214. PCBs 216, affixed to the main chassis body 202, include electronic devices (not shown) that, among other things, produce and dissipate heat.

During operation, heat is removed when cool air is injected via inlets in the bottom portion 204 through the enclosure 100 and out of the LRU via the holes 106 in the top portion 206. As noted above, several features of the LRU enclosure 100 render its cooling capabilities as being deficient in many instances. One of the most significant disadvantages is that electronic devices mounted on the PCBs 216 are directly exposed to air from an external environment, which streams and circulates around the electronic devices.

Figure 3:
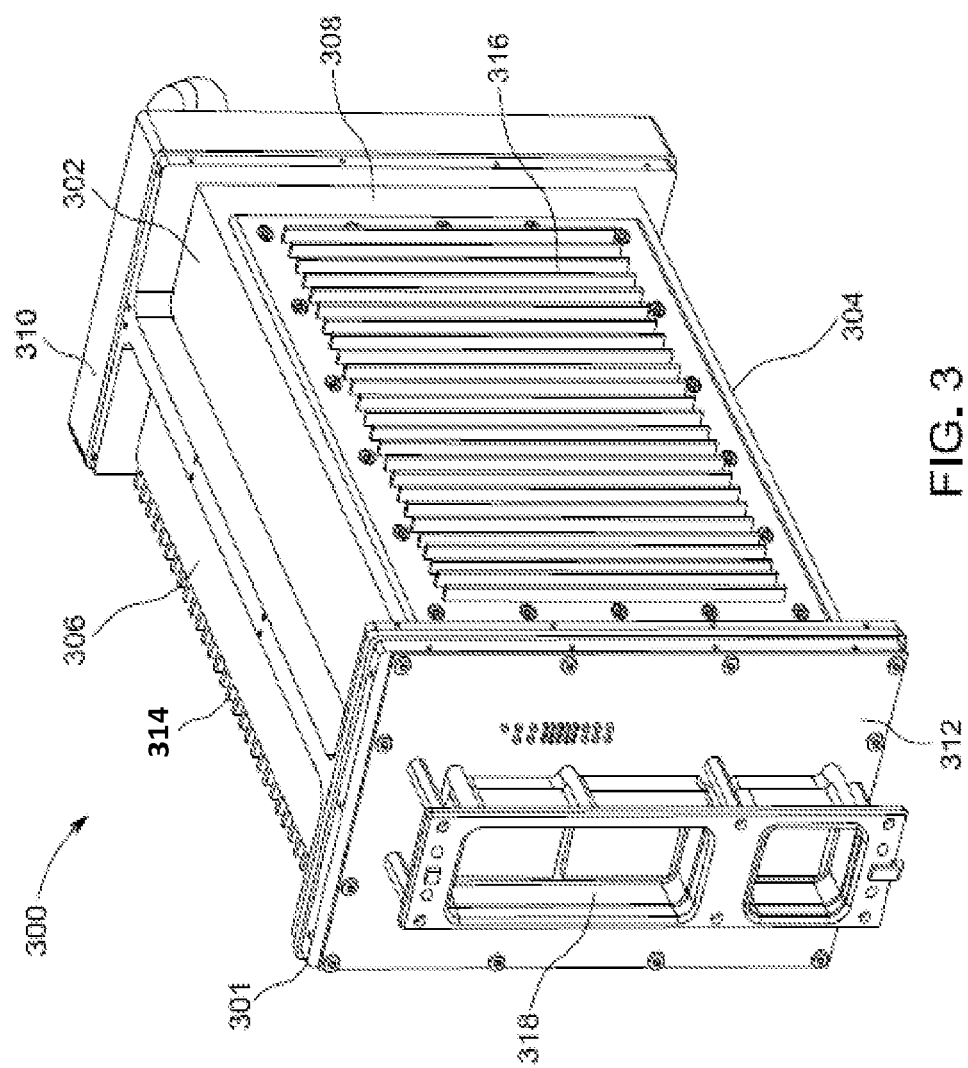
FIG. 3 is an illustration of a sealable enclosure 300 constructed in accordance with embodiments of the present invention.

FIG. 3 is an illustration of a sealable enclosure 300 constructed in accordance with embodiments of the present invention. During operation, an exterior portion of the enclosure 300, viewable in FIG. 3, will be in contact with an external environment (e.g., outside world). Electronic devices, mounted on PCBs, are hermetically encapsulated inside the enclosure 300.

The idea of the enclosure 300 is that the encapsulated electronics can be cooled with air in accordance with the ARINC 600 standards while the electronics are encapsulated—without the electronic devices being exposed to air from the external environment.

By way of example, the enclosure 300 can achieve an IP65, IP66, and IP67 Titans rating and can achieve valve pressures in accordance with the ARINC 600 standards. Valves are used in enclosures, such as the enclosure 300, to facilitate decompression. Tightness of the seal can be achieved through the use of gaskets and sealed screws.

The enclosure 300 includes a main body 301, top and bottom panel portions 302 and 304, respectively, along with side panel portions 306, 308, 310, and 312. The side panel portions 306 and 308 include fins (e.g., heat sinks) 314 and 316, respectively. The side panel portion 312 is formed of an input/output (IO) PCB configured for mounting electronic devices.

By way of example, and not limitation, the top 302, bottom 304, and side panel portions 306, 308, 310, and 312 can be hermetically sealed. In this example, the I/O PCB 312 serves as a backplane and is an integral component of the sealing process. The electronic devices can be mounted on one side of the PCB 312. In the exemplary enclosure 300 of FIG. 3, a connector 318 is mounted on the other side of the PCB 312.

In the enclosure 300, the electronic devices are encapsulated within the main body 301. To facilitate cooling, air can stream around the main body 301, which can be covered by simple sheet metal external enclosure (illustrated in FIG. 4). As the air streams, it also blows across the heat sinks 314 and 316, facilitating the transfer of heat from the heat sinks 314 at 316 into the cooling air via a convection process.

The simple sheet metal will have openings at top and bottom sections according to the ARINC 600 specification standard. As cooling air streams in through the bottom and streams along the side on the heat sinks 314 and 316 of the main body 301, the heat sinks 314 and 316 absorb and evacuate the produced by the electronic devices. The cooling air can then be evacuated out of the top and bottom of the sheet metal external enclosure. In this manner, the electronic devices are never directly exposed to the cooling air.

Electronics are encapsulated within the main body 301 of the enclosure 300 (i.e., inner enclosure). The heat produced by the electronic devices is absorbed by the heat sinks 314 at 316 by heat conduction. A more detailed explanation of the cooling of the encapsulated portion of the main body 301 is provided below.

Figure 4:
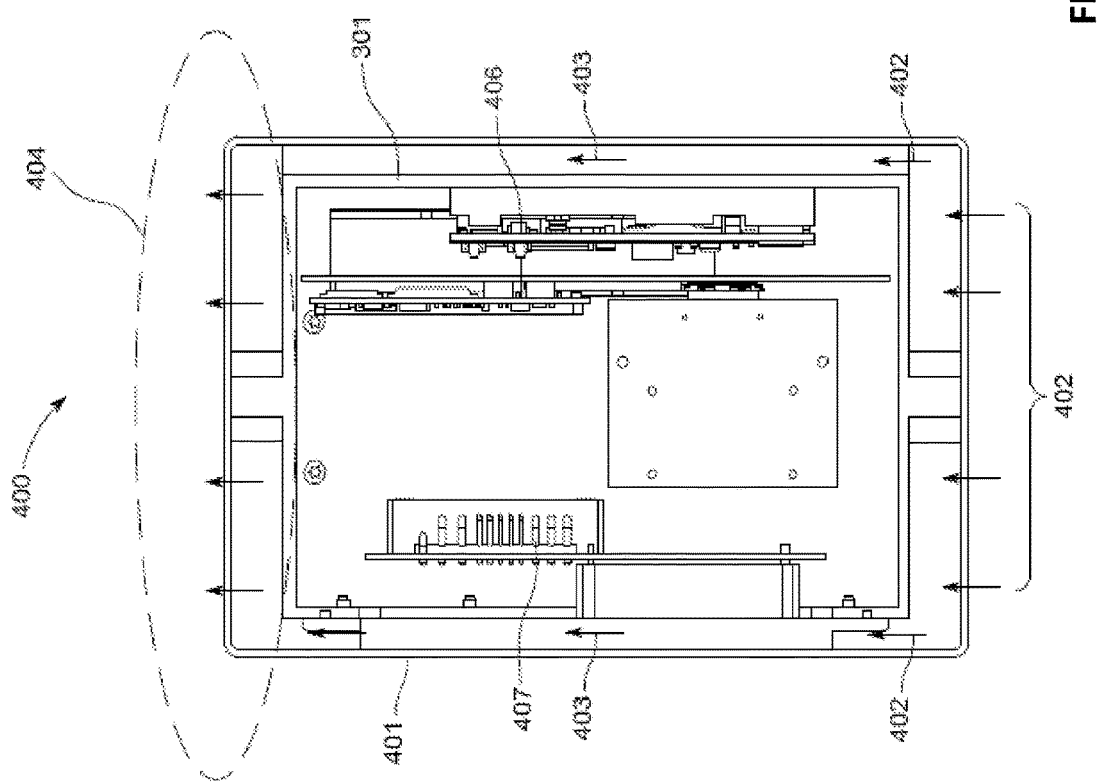
FIG. 4 is a cross-sectional view of an interior portion of the enclosure illustrated in FIG. 3.

FIG. 4 is a cross-sectional view of an interior portion 400 of the enclosure 300. In accordance with the ARINC 600 specification, cooling air, represented by arrows 402, enters at the bottom of the external enclosure 401 and streams around 403 the encapsulated main body 301. The cooling air, after being heated by the electronic devices, exits 404 the outer enclosure 401 at a desired outlet location in accordance with the ARINC 600 specification.

In the manner above, the cooling air evacuates the heat along the side panels 306 and 308 of the main body 301, thus removing it from electronic devices, such as a computer module 406 and a power supply 407. The computer module 406 and the power supply 407 are never exposed to the cooling air. The heat is transported along the side walls of the main body 301, being absorbed by the cooling air via heat convection, and transported into the outer enclosure 401.

Embodiments of the present invention offer a more reliable cooling enclosure having a lower MTBF using conduction cooling, which is a more efficient cooling process. With respect to the ARINC 600 specification, with different PCBs having different heat sinks, the air streams through the heat sinks. In this scenario, one heat sink, for example, closest to the cooling air, can have a larger pressure drop.

The ARINC 600 specification also defines a pressure drop across the LRU which must remain within specified limits. This requirement tours that the cooling air is equally distributed across the LRUs, which are generally installed parallel to each other. By way of example, once the pressure drops across the enclosure 301, it can be adjusted to equalize any changes related to heat produced by the internal electronic devices. As noted above, valves can be used as a mechanism for controlling and facilitating the different pressure drops, pressure levels, and decompression.

The valves, in essence, equalize the different pressure environments. The ability to accommodate different pressure levels enables the LRU's to be used at sufficiently high altitudes without the risk of destruction due, for example, to explosions because of over pressure.

Referring back to FIG. 3, the backplane PCB 312 is used to form one of the side panels of the enclosure 301. The connector 318 is attached to the PCB 312 and provides connectivity for power, as well as accommodating the input and output of processor signals. In the case of aircraft, for example, the electronics to the aircraft are transferred through the connector 318.

Since the backplane PCB 312 can be removable, a variety of gaskets can be used to facilitate a tight seal. On example of an efficient type gasket is to have an O-ring configured for placement in a groove. The O-ring and the groove can be pressed into place. The use of an O-ring is merely one approach to attaching the backplane PCB 312 and forming a tight seal. The O-ring, or other suitable sealing technique, can ensure that the seal between the PCB 312 and the rest of the enclosure 300 will be devoid of any holes. Screws, with sealing material, can be used as an added measure. Using this approach, the PCB 312 can be used to actually form the seal. In conventional ARINC 600 LRUs, for example, a separate plate is used as a side panel to form the seal.

CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

I claim:

1. An enclosure for encapsulating one or more printed circuit boards (PCBs) inside the enclosure, the one or more PCBs configured for having electronic devices mounted thereon, comprising:
a main chassis body including a bottom portion;
an outer wall including connectable panels for encasing the main chassis body; and
a top portion configured for completing a seal between the main chassis body and the outer wall;
wherein a PCB forms one of the connectable panels.

2. The enclosure of claim 1, wherein the one PCB forms a seal between the main chassis body, the outer wall, and the top portion.

3. The enclosure of claim 2, wherein electronic devices mounted on the PCB that forms one of the connectable panels are positioned within the enclosure.

4. The enclosure of claim 1, wherein the encapsulating is in accordance with Aeronautical Radio, Incorporated (ARINC) 600 standards.

5. The enclosure of claim 4, wherein one or more of the connectable panels includes a heat evacuation mechanism.

6. The enclosure of claim 5, wherein the heat evacuation mechanism includes a heat sink.

7. The enclosure of claim 6, wherein the seal is a hermetic seal.

8. The enclosure of claim 7, further comprising an external enclosure for housing the main body.

9. The enclosure of claim 1, wherein the electronic devices mounted on the one or more PCBs inside the enclosure are not exposed to an environment outside of the enclosure.

10. The enclosure of claim 1, wherein the enclosure further comprises a valve configured to facilitate decompression of the inside of the enclosure.

11. An enclosure for encapsulating one or more printed circuit boards (PCBs) inside the enclosure, the one or more PCBs configured for having electronic devices mounted thereon, comprising:
a main chassis body including a bottom portion;
an outer wall including connectable panels for encasing the main chassis body; and
a top portion configured for completing a seal between the main chassis body and the outer wall;
wherein a PCB forms one of the connectable panels;
wherein one or more of the connectable panels includes a heat conduction mechanism for absorbing heat from the electronic devices.

12. The enclosure of claim 11, wherein the enclosure is configured to facilitate circulation of cooling air external to the main chassis body, the heat being absorbed by the cooling via convection.

13. The enclosure of claim 11, wherein the PCB that forms one of the connectable panels forms the seal between the main chassis body, the outer wall, and the top portion.

14. The enclosure of claim 12, wherein the encapsulating is in accordance with Aeronautical Radio, Incorporated (ARINC) 600 standards.

15. The enclosure of claim 13, wherein electronic devices mounted on the PCB that forms one of the connectable panels are positioned within the enclosure.

16. The enclosure of claim 15, wherein the heat conduction mechanism includes a heat sink.

17. The enclosure of claim 16, wherein the seal is a hermetic seal.

18. An enclosure constructed in accordance with Aeronautical Radio, Incorporated (ARINC) 600 standards for encapsulating one or more printed circuit boards (PCBs) inside the enclosure, the one or more PCBs configured for having electronic devices mounted thereon, comprising:
a main chassis body including a bottom portion;
an outer wall including connectable panels for encasing the main chassis body; and
a top portion configured for completing a seal between the main chassis body and the outer wall;
wherein a PCB forms one of the connectable panels;
wherein one or more of the connectable panels includes a heat conduction mechanism for absorbing heat from the electronic devices.

19. The enclosure of claim 18, wherein the heat conduction mechanism includes a heat sink.

20. The enclosure of claim 19, wherein the seal is a hermetic seal.

* * * * *